United States Patent
Sun et al.

(10) Patent No.: US 11,112,912 B2
(45) Date of Patent: Sep. 7, 2021

(54) CALIBRATION DEVICE AND METHOD FOR FREQUENCY POINT IN TOUCH SCREEN, TOUCH SCREEN AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jigang Sun, Beijing (CN); Wei Sun, Beijing (CN); Pengjun Chen, Beijing (CN)

(73) Assignees: BOE TECHNOLOGY GROUP CO., LTD., Beijing (CN); ORDOS YUANSHENG OPTOELECTRONICS CO.. LTD, Inner Mongolia (CN)

( * ) Notice: Subject to any disclaimer, the term of this patent is extended or adjusted under 35 U.S.C. 154(b) by 592 days.

(21) Appl. No.: 16/062,953

(22) PCT Filed: Sep. 29, 2017

(86) PCT No.: PCT/CN2017/104175
§ 371 (c)(1),
(2) Date: Jun. 15, 2018

(87) PCT Pub. No.: WO2018/157595
PCT Pub. Date: Sep. 7, 2018

(65) Prior Publication Data
US 2021/0072851 A1 Mar. 11, 2021

(30) Foreign Application Priority Data
Mar. 2, 2017 (CN) .......................... 201710120902.2

(51) Int. Cl.
G06F 3/044 (2006.01)
G06F 3/041 (2006.01)
G01R 27/26 (2006.01)

(52) U.S. Cl.
CPC ......... *G06F 3/044* (2013.01); *G01R 27/2605* (2013.01); *G06F 3/0418* (2013.01)

(58) Field of Classification Search
CPC .... G01R 27/2605; G06F 3/044; G06F 3/0418
(Continued)

(56) References Cited

U.S. PATENT DOCUMENTS

| 8,130,212 B2 | 3/2012 | Umeda |
| 8,170,822 B2 | 5/2012 | Lu et al. |

(Continued)

FOREIGN PATENT DOCUMENTS

| CN | 101566901 A | 10/2009 |
| CN | 102681724 A | 9/2012 |

(Continued)

OTHER PUBLICATIONS

International Search Report dated Dec. 29, 2017 corresponding to application No. PCT/CN2017/104175.
(Continued)

*Primary Examiner* — Abdul-Samad A Adediran
(74) *Attorney, Agent, or Firm* — Nath, Goldberg & Meyer; Joshua B. Goldberg

(57) ABSTRACT

The calibration device is used for automatically calibrating capacitances of a sensing capacitor at various frequency points in the touch screen, and comprising a calibration circuit and a comparison circuit. The calibration circuit is connected with the sensing capacitor and the comparison circuit to transmit a calibration excitation signal to the touch screen to start calibration operations at the various frequency points, and calibrate the sensing capacitor in the touch screen according to a comparison result from the comparison circuit; the comparison circuit is used for comparing a preset capacitance with the capacitance of the sensing capacitor at a current frequency point in the touch screen to obtain the comparison result, and feeding the comparison result back to the calibration circuit, and the calibration (Continued)

circuit calibrates the capacitance of the sensing capacitor to a capacitance that matches with the current frequency point.

20 Claims, 2 Drawing Sheets

(58) Field of Classification Search
USPC .......................................................... 345/174
See application file for complete search history.

(56) References Cited

U.S. PATENT DOCUMENTS

| | | | |
|---|---|---|---|
| 8,860,432 | B2 | 10/2014 | Shen et al. |
| 2013/0106779 | A1 | 5/2013 | Company Bosch et al. |
| 2014/0022203 | A1* | 1/2014 | Karpin ............... G01R 27/2605 345/174 |

FOREIGN PATENT DOCUMENTS

| | | | |
|---|---|---|---|
| CN | 104254824 | A | 12/2014 |
| CN | 106909252 | A | 6/2017 |
| JP | 2011197942 | A | 10/2011 |
| TW | 201035842 | A | 10/2010 |
| TW | 201035842 | A1 | 10/2010 |

OTHER PUBLICATIONS

First Office Action dated Feb. 22, 2019, for corresponding Chinese application 201710120902.2 and English translation.

* cited by examiner

CALIBRATION DEVICE AND METHOD FOR FREQUENCY POINT IN TOUCH SCREEN, TOUCH SCREEN AND DISPLAY DEVICE

CROSS-REFERENCE TO RELATED APPLICATIONS

This is a National Phase Application filed under 35 U.S.C. 371 as a national stage of PCT/CN2017/104175, filed Sep. 29, 2017, an application claiming the benefit of Chinese Application No. 201710120902.2, filed Mar. 2, 2017, the content of each of which is hereby incorporated by reference in its entirety.

TECHNICAL FIELD

The disclosure relates to the technical field of display technology, in particular relates to a calibration device and method for frequency point in a touch screen, a touch screen, and a display device.

BACKGROUND

A touch screen provides a new type of human-computer interaction input method, especially provides people with a better control experience through a combination of the touch screen and a flat panel display. The touch screen and the display panel is most commonly combined in an In-cell mode, in which a touch circuit is embedded in a pixel of the display panel.

The in-cell mode touch screen includes a touch IC, and a transmitting electrode and a receiving electrode connected to the touch IC. A sensing capacitor is formed between the transmitting electrode and the receiving electrode. A difference in a capacitance between the two electrodes of the sensing capacitor is sensed by the touch IC to determine whether a finger touch occurs or not. It is also required to calibrate the sensing capacitor according to an application environment of the touch screen.

In an operation process of the touch screen, the touch screen can only operate at one frequency point at a certain moment, and the frequency point is selected by frequency hopping. Use of the in-cell mode touch screen is affected by an external environment inevitably, such as noise caused by charging, and the like. Therefore, in a debugging process of the touch screen, the selection of frequency hopping becomes a critical step. When the noise is introduced due to the change of the external environment, a capacitance of the sensing capacitor at a current frequency point increases, and then the touch IC automatically selects another frequency point (i.e., frequency hopping). Particularly, the touch IC selects a frequency point at which the touch IC undergoes a minimal impact from the external environment for operation, so as to achieve anti-interference purpose.

Therefore, it has become a technical problem to be solved urgently to design a scheme in which capacitance of the sensing capacitor of the touch screen is automatically calibrated at various frequency points in various environments so that the calibrated frequencies of the touch screen at the various frequency points is consistent.

SUMMARY

In order to solve at least the foregoing technical problem existing in the prior art, the embodiments of the disclosure provide a calibration device for frequency point in a touch screen, touch screen and display device, which can automatically calibrate the capacitances of a sensing capacitor in the touch screen at various frequency points in various environments.

An embodiment of the disclosure provides a calibration device for frequency point in a touch screen, the calibration device performs automatic calibration on capacitances of a sensing capacitor in the touch screen at various frequency points. The calibration device includes a calibration circuit and a comparison circuit. The calibration circuit is connected with the sensing capacitor and the comparison circuit, transmits a calibration excitation signal to the touch screen to start calibration operations at the various frequency points, and calibrates the sensing capacitor in the touch screen according to a comparison result from the comparison circuit. The comparison circuit compares a preset capacitance with the capacitance of the sensing capacitor in the touch screen at a current frequency point to obtain a comparison result, and feeds the comparison result back to the calibration circuit, so that the capacitance of the sensing capacitor is calibrated to a capacitance that matches with the current frequency point.

Optionally, the comparison circuit includes a plurality of comparison sub-circuits in parallel, each of which is connected to a corresponding sensing capacitor in the touch screen. The comparison sub-circuit returns a difference between the preset capacitance and the capacitance of the sensing capacitor in the touch screen at the current frequency point to the calibration circuit, and the calibration circuit calibrates the capacitance of the sensing capacitor at the current frequency point.

Optionally, each of the comparison sub-circuits includes a comparator, a feedback capacitor and a ground capacitor. The comparator compares a preset capacitance with the capacitance of the sensing capacitor in the touch screen at the current frequency point, and the feedback capacitor feeds the comparison result back to the calibration circuit.

Optionally, a preset value of the feedback capacitor equals to an average value of initial values of the feedback capacitors corresponding to the frequency points.

Optionally, the feedback capacitor is a variable capacitor.

Optionally, the various frequency points includes two to six frequency points in different frequency bands.

Optionally, the various frequency points includes three frequency points, which are at a low frequency, a middle frequency and a high frequency, respectively.

Optionally, the calibration excitation signal transmitted to the touch screen by the calibration circuit includes a plurality of square signals with different timings, and a pulse width of each of the square signals matches with a corresponding frequent point.

Optionally, the calibration circuit performs a preliminary calibration on the capacitances of the sensing capacitor in the touch screen at the various frequency points, and the comparison circuit compares the preset capacitance with the capacitance of the sensing capacitor at the current frequency point after the preliminary calibration, and feeds the comparison result back to the calibration circuit.

An embodiment of the disclosure provides a calibration method for frequency point in a touch screen, including:

Transmitting a calibration excitation signal to the touch screen to start calibration operations at various frequency points;

Collecting a capacitance of a sensing capacitor in the touch screen at each of the various frequency points; and Calibrating a capacitance of the sensing capacitor at a current frequency point to a capacitance that matches with the current frequency point, by compensating the sensing capacitor according to a difference between a preset capacitance and the capacitance of the sensing capacitor at the current frequency point.

Optionally, the calibration excitation signal transmitted to the touch screen includes a plurality of square signals with different timings, and a pulse width of each of the square signals matches with a corresponding frequent point.

Optionally, the calibration method further includes: establishing a corresponding relationship between the capacitance of the sensing capacitor and the preset capacitance at each of the frequency points.

Optionally, before the step of establishing a corresponding relationship between the capacitance of the sensing capacitor and the preset capacitance at each of the frequency points, the calibration method further includes: performing a preliminary calibration on the capacitances of the sensing capacitor in the touch screen at the various frequency points; and The step of establishing a corresponding relationship between the capacitance of the sensing capacitor and the preset capacitance at each of the frequency points further includes: establishing a corresponding relationship between the capacitance of the sensing capacitor at each of the frequency points after the preliminary calibration and the preset capacitance.

An embodiment of the disclosure provides a touch screen, including a plurality of sensing capacitors and the calibration device described above.

An embodiment of the disclosure provides a display device including the touch screen described above.

DETAILED DESCRIPTION

To enable those skilled in the art to better understand the technical solutions of the present disclosure, a device and method for calibrating a frequency point in a touch screen, a touch screen, and a display device will be further described in detail in conjunction with the accompanying drawings and specific implementations.

An existing touch screen generally does not have a function of automatically calibrating the sensing capacitor. As an exception, although some advanced applications are equipped with an automatic calibration function, this automatic calibration function can only calibrate the entire touch screen indistinguishably and uniformly. Moreover, the touch screen is usually calibrated at a component factory or at a panel factory (such as a mobile phone factory) in downstream. This calibration is not performed in real time based on the noise existing in the current operating environment of the touch screen.

As for an existing case in which the touch screen generally does not have an automatic calibration function or the automatic calibration function can only calibrate the touch screen indistinguishably and uniformly, the embodiments of the present disclosure provide a device and method for calibrating a frequency point in a touch screen, which is capable of automatically calibrating a capacitance of a sensing capacitor in the touch screen at different frequency points for different environments. Thus, the touch screen is provided with a function of distinguishably and automatically calibrating the capacitances of the sensing capacitor at the different frequency points, so that the calibration frequencies of the touch screen at all the frequency points are consistent.

In general, a touch function of the touch screen is realized through a touch IC. Each touch IC has its own FW (Firmware) and different frequent points are preset for the touch IC, in consideration of a different interference due to a different external power supply. The frequency hopping is performed according to characteristics of display panels from different component factories. Generally, a frequency-hopping frequency is also selected according to the characteristics of the display panels from the different component factories. An intuitive understanding for the frequency hopping is that layers in the touch screen have different thickness and dielectric constant, thereby resulting in different capacitance for the sensing capacitors; Multiple scan frequencies are preset before a touch scan. Among the multiple scan frequencies, a frequency point at which the touch IC undergoes a minimal impact is selected when interference is encountered. In the vast majority of cases, the frequency hopping of the touch IC is realized between about three frequency points to improve the function of anti-interference. These three frequency points can prevent the touch screen from being subjected to full-band noises between 100 Hz and 400 kHz.

Figure 1:
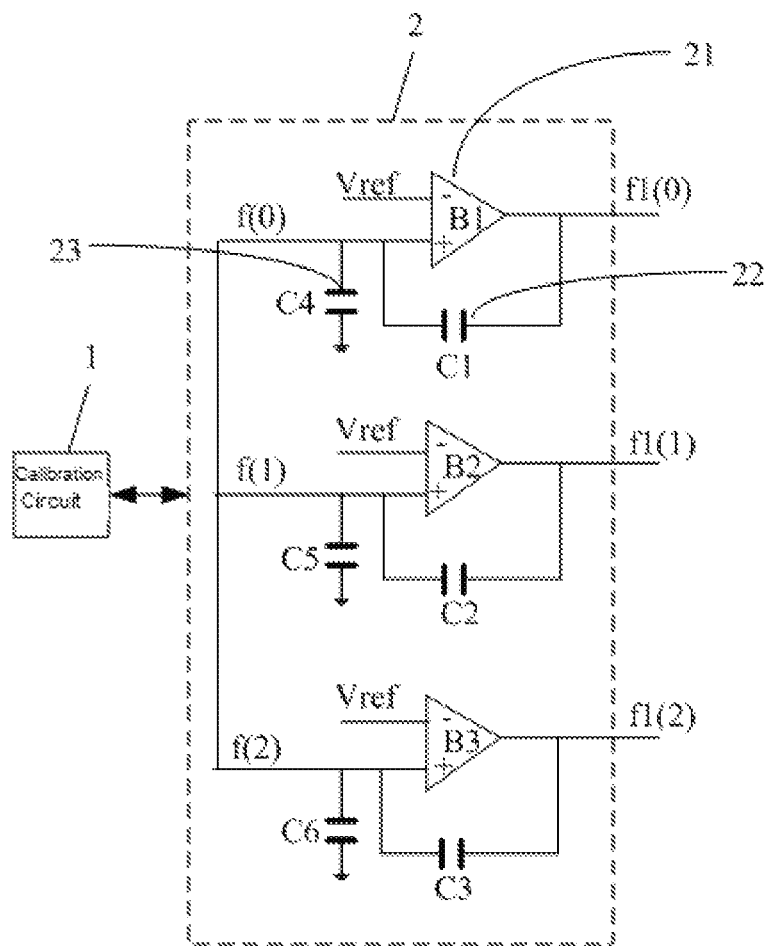
FIG. 1 is a schematic circuit diagram of a calibration device for frequency point in a touch screen according to an embodiment of the disclosure.

As shown in FIG. 1, a calibration device for frequency point in a touch screen may automatically calibrate capacitances of a sensing capacitor in the touch screen at different frequency points, and include a calibration circuit 1 and a comparison circuit 2.

The calibration circuit 1 is connected with the sensing capacitor and the comparison circuit 2 to transmit a calibration excitation signal to the touch screen to start calibration operations at the different frequency points, and calibrates the sensing capacitor in the touch screen according to a comparison result from the comparison circuit 2.

The comparison circuit 2 compares a preset capacitance with the capacitance of the sensing capacitor in the touch screen at a current frequency point to obtain the comparison result, and feeds the comparison result back to the calibration circuit 1, and the calibration circuit 1 calibrates the capacitance of the sensing capacitor to a capacitance that matches with the current frequency point (that is the preset capacitance).

The calibration device automatically and distinguishingly calibrates the capacitances of the sensing capacitor in the touch screen at the different frequency points. The comparison circuit 2 includes a plurality of comparison sub-circuits in parallel, each of which is connected to the sensing capacitor in the touch screen, the comparison sub-circuit returns a difference between the preset capacitance and the capacitance of the sensing capacitor in the touch screen at the current frequency point to the calibration circuit 1, and the calibration circuit 1 calibrates the capacitance of the sensing capacitor at the current frequency point. Generally, both the electrode plates of the sensing capacitor are connected to inputs of the touch IC, therefore the comparison circuit 2 may be connected to each of the inputs of the touch IC. The function for automatically and distinguishingly calibrating the capacitances of the sensing capacitor in the touch screen at the different frequency points may be realized, with division of the comparison circuit 2 into a plurality of comparison sub-circuits, and calibration of a capacitance of a corresponding sensing capacitor at the current frequency point by each of the comparison sub-circuits.

In an embodiment, the calibration circuit 1 may perform a preliminary calibration on the capacitances of the sensing capacitor in the touch screen at the different frequency points, and the comparison circuit 2 compares the preset capacitance with the sensing capacitance of the sensing capacitor at the current frequency point subject to the preliminary calibration, and feeds the comparison result back to the calibration circuit 1.

According to a circuit principle, a capacitance and a voltage have a definite corresponding relationship therebetween. The capacitance of the sensing capacitor at a certain frequency point is another expression of the voltage essentially. The capacitance may be calibrated by calibrating the voltage. In the calibration device, a reference voltage Vref of the sensing capacitor at each frequency point is preset (the reference voltage Vref is a voltage corresponding to the preset capacitance), the preset reference voltage Vref is compared with a voltage of the sensing capacitor subjected to the preliminary calibration by the calibration circuit 1, and the capacitance of the sensing capacitor is calibrated to a capacitance that is expected ultimately (that is the preset capacitance) by compensating the voltage of the sensing capacitor.

Each comparison sub-circuit includes a comparator 21 (B1, B2, B3 in FIG. 1), a feedback capacitor 22 (capacitors C1, C2, C3 in FIG. 1) and a ground capacitor 23 (capacitors C4, C5, C6 in FIG. 1). A positive input terminal of the comparator 21 is connected to one end of the feedback capacitor 22 and one end of the ground capacitor 23. The reference voltage Vref is input to a negative input terminal of the comparator 21. The other end of the feedback capacitor 22 is connected to an output terminal of the comparator 21. The other end of the ground capacitor 23 is grounded. The output terminal of the comparator 21 is connected to the sensing capacitor. With a plurality of comparison sub-circuits, a distinguishing and automatic calibration on the capacitance of the sensing capacitor in the touch screen at each frequency point may be realized.

Taking into account of the application environments of the touch screen, the frequency points of the touch screen may include two to six frequency points in different frequency bands, so that a distinguishing and automatic calibration on the sensing capacitor may be realized according to different frequency points. In an embodiment, the frequency points of the touch screen may include three frequency points in the different frequency bands. The three frequency points are respectively in the ranges of low frequency, middle frequency, and high frequency. The capacitances of the sensing capacitor at the three frequency points may be calibrated automatically, so as to realize an accurate calibration and adjustment on the sensing capacitor in the different frequency bands.

The reason is that, in the existing touch screen products, taking into account of the scanning frequency of 100 Hz-400 kHz in the full frequency band, the calibration function in some advanced applications cannot distinguish the difference in capacitance of the sensing capacitor at different frequency points. Because different frequency points are relatively decentralized, this self-contained calibration function can also compensate the capacitances of the sensing capacitor at three frequency points, and compensation values for the sensing capacitor at the three frequency points are consistent. In case that unexpected conditions occur during the calibration process (for example, the external frequency interferes with the frequency of a certain frequency point), the scheme of always using a same compensation value to perform the calibration results in high or low capacitance of the sensing capacitor at the problematic frequency point (i.e., the interfered frequency point) during compensation, which may cause abnormalities in the capacitance of the sensing capacitor at one or more frequency points. As a result, the calibration result cannot completely ensure the consistency of the calibrated capacitance of the sensing capacitor at the preset frequency points in the frequency bands.

In the circuit of the calibration device according to FIG. 1, the capacitances of the sensing capacitor at the three frequency points is compared with the expected capacitance of the sensing capacitor after calibration (i.e., the preset capacitance), respectively, and compensation is performed on any capacitance that does not meet the requirement after comparison by the compensation circuit (i.e., a circuit including the comparator 21 and the feedback capacitor 22), so that the capacitance of the sensing capacitor at the three frequency points tend to be consistent. When the voltage of the sensing capacitor is greater than the corresponding reference voltage, the voltage of the sensing capacitor is compensated by adjusting the capacitors C1, C2, and C3 as the feedback capacitor 22, so that the capacitance of the sensing capacitor is calibrated to the expected capacitance. The initial values of the capacitance of the capacitors C1, C2, and C3 may be calculated based on the RC loading and the lamination structure of the touch screen itself or the initial values of the capacitance of the capacitors C1, C2, and C3 may be obtained through simulation. It should be noted that, each of the feedback capacitors in the comparison sub-circuits is a variable capacitor. A capacitor formed by the transmitting electrode and the receiving electrode for realizing the touch function of the touch screen is the sensing capacitor.

In an embodiment, a preset value of the capacitance of the feedback capacitor 22 is equal to an average of the initial values of the capacitances of the feedback capacitor at all the frequency points. In the calibration device according to the embodiment, the preset values of the capacitance of the three feedback capacitors 22 at the three frequency points may be set to be the same; the preset values of the capacitance of the feedback capacitor 22 in all the comparison sub-circuits may also be set to be the same. The actual capacitance of the feedback capacitor 22 is related to the capacitance of the sensing capacitor. By adjusting the capacitance of the feedback capacitor 22, a distinguishing calibration on the capacitance of the sensing capacitor can be achieved. Generally, the touch screen may operate at three different operating frequencies. These three different operating frequencies cannot be selected at the same time, and it is expected that the capacitance of the entire sensing capacitor in the touch screen at different operating frequencies has a good consistency. In the calibration device of the embodiment, the three feedback capacitors 22 are all variable capacitors. When there is a difference between the received capacitance of the sensing capacitor and the preset capacitance (which may be referred to as a standard capacitance) corresponding to the reference voltage Vref, the feedback capacitor 22 is adjusted according to the difference in capacitance.

It should be understood here that, in order to improve efficiency, the calibration process is usually performed only once and is implemented by establishment of a hardware circuit. Therefore, the capacitances of the sensing capacitor at different frequency points after calibration may not be exactly the same, but relatively consistent. According to a simulation measurement, after the calibration of the calibration device is completed, if the difference in the capacitances of the sensing capacitor is approximately within 20 (no unit, it is a quantized value), the calibration is considered completed.

In order to perform the calibration operation, a calibration excitation signal transmitted by the calibration circuit 1 to the touch screen includes a plurality of square wave signals having different timings, and a pulse width of each square wave signal is adapted to a corresponding frequency point. The touch IC sends the calibration excitation signal to the calibration circuit 1 so as to start the calibration function at the different frequency points. Specifically, first, an entire surface capacitance f(0) at a first frequency point is selected, and then the sensing capacitor in each touch IC is matched with a corresponding compensation circuit so as to compensate for the capacitance of the sensing capacitor on the touch IC until a preset condition is satisfied. In the same way, the capacitance f(1) of the sensing capacitor at a second frequency point and the capacitance f(2) of the sensing capacitor at a third frequency point are compensated until the conditions are satisfied. In FIG. 1, the function f(i) (i=0, 1, 2) represents the capacitances of the sensing capacitor at the three frequency points after the preliminary calibration by the calibration circuit 1. The function f1(i) (i=0, 1, 2) represents the capacitances of the sensing capacitor at the three frequency points that are fed back to the calibration circuit 1 after the comparison of the comparison circuit 2 and compensated by the calibration circuit 1 (i.e., a sum of the capacitance of the sensing capacitor after preliminary calibration and the capacitance of the feedback capacitor). Generally, the difference between the function f(i) and the corresponding f1(i) is 80-100.

When a calibration is needed, for example, when the touch screen and the display substrate are assembled to operate for the first time or when there is no touch action and real-time calibration is needed, the calibration circuit 1 sequentially calibrates the capacitances of the sensing capacitor at the three frequency points according to the corresponding compensation values for the first time, and then the calibration circuit 1 determines internally and automatically whether the calibration is enough. If the calibration is not enough, a second calibration process is continued, that is, the calibration circuit 1 calibrates the capacitances of the sensing capacitor again, until the voltages of the sensing capacitor at the three frequency points are consistent (in general circumstances, the calibration object can be achieved by two calibration processes), the calibration is enough at this time. When the calibration is enough, the calibration circuit 1 feeds back the calibration result to the touch IC to complete the calibration, which means the calibration for the three frequency points is finally completed.

With the calibration device of the embodiment, the capacitances of the sensing capacitor at the three frequency points can be calibrated to a relatively close level. When the external noise exists, the touch chip can select or match a frequency point at which the touch IC undergoes a minimal impact from the external environment for operation as needed, so as to avoid a situation that the touch IC cannot perform frequency hopping due to the abnormal capacitances of the sensing capacitor at some frequency points, thereby avoiding a waste of frequency points and occurrence of touch ghost and the like.

In an embodiment of the disclosure, a calibration method for frequency point in a touch screen is provided, the calibration method can distinguishably calibrate the capacitances of the sensing capacitor in the touch screen at the different frequency points. The calibration method includes:

transmitting a calibration excitation signal to the touch screen to start calibration operations at various frequency points;

collecting a capacitance of a sensing capacitor in the touch screen at each of the various frequency points; and calibrating the capacitance of the sensing capacitor at a current frequency point to a capacitance that matches with the current frequency point, by compensating the sensing capacitor according to a difference in capacitance between a preset capacitance and the capacitance of the sensing capacitor at the current frequency point.

The calibration method can automatically calibrate the capacitances of the sensing capacitor in the touch screen at the different frequency points for different environments, whereby providing a function of distinguishably calibrating the capacitances of the sensing capacitor in the touch screen at the different frequency points.

In an embodiment, the calibration method further includes a step of: establishing a corresponding relationship between the capacitance of the sensing capacitor and the preset capacitance at each of the frequency points.

In an embodiment, before the step of establishing a corresponding relationship between the capacitance of the sensing capacitor and the preset capacitance at each of the frequency points, the calibration method further includes: performing a preliminary calibration on the capacitances of the sensing capacitor in the touch screen at the different frequency points. In an embodiment, the step of establishing a corresponding relationship between the capacitance of the sensing capacitor and the preset capacitance at each of the frequency points further includes: establishing a corresponding relationship between the capacitance of the sensing capacitor at each of the frequency points subject to the preliminary calibration and the preset capacitance.

In an embodiment, the calibration excitation signal transmitted to the touch screen includes multiple square signals with different timings, a pulse width of each of the square signals matches with a corresponding frequent point. With transmission of the calibration excitation signal to the touch screen, the calibration on the sensing capacitor at the different frequency points can be started.

According to the calibration method and the calibration device, in case that the difference in the capacitance of the sensing capacitor at the three frequency points is too large due to an emergency situation (such as abnormal power off, Electro-Static Discharge (ESD) or unconscious touch by hand) occurring during the calibration process so that the frequency hopping is not realized, the voltage of the sensing capacitor at each frequency point and the preset reference voltage Vref are compared; the voltage of the sensing capacitor at the frequency point is compensated when the voltage of the sensing capacitor at the frequency point is greater or less than the preset reference voltage Vref, so that the capacitances of the sensing capacitor at the three frequency points tend to be consistent.

In cast that there is a difference in the capacitance of the sensing capacitor at the different frequency points and the calibrated capacitances of the sensing capacitor at different frequency points by the touch IC is inconsistent, the calibration method and the calibration device according to the disclosure sets dependent feedback capacitors, and compensates the sensing capacitor according to the difference between the preset capacitance and the capacitance of the sensing capacitor at the current frequency point, so that the calibration frequencies of the sensing capacitor at the different frequency points tend to be consistent.

An embodiment of the present disclosure further provides a touch screen, which includes a plurality of sensing capacitors, each of which is formed by a transmitting electrode and a receiving electrode, and further includes the calibration device described above.

Figure 2:
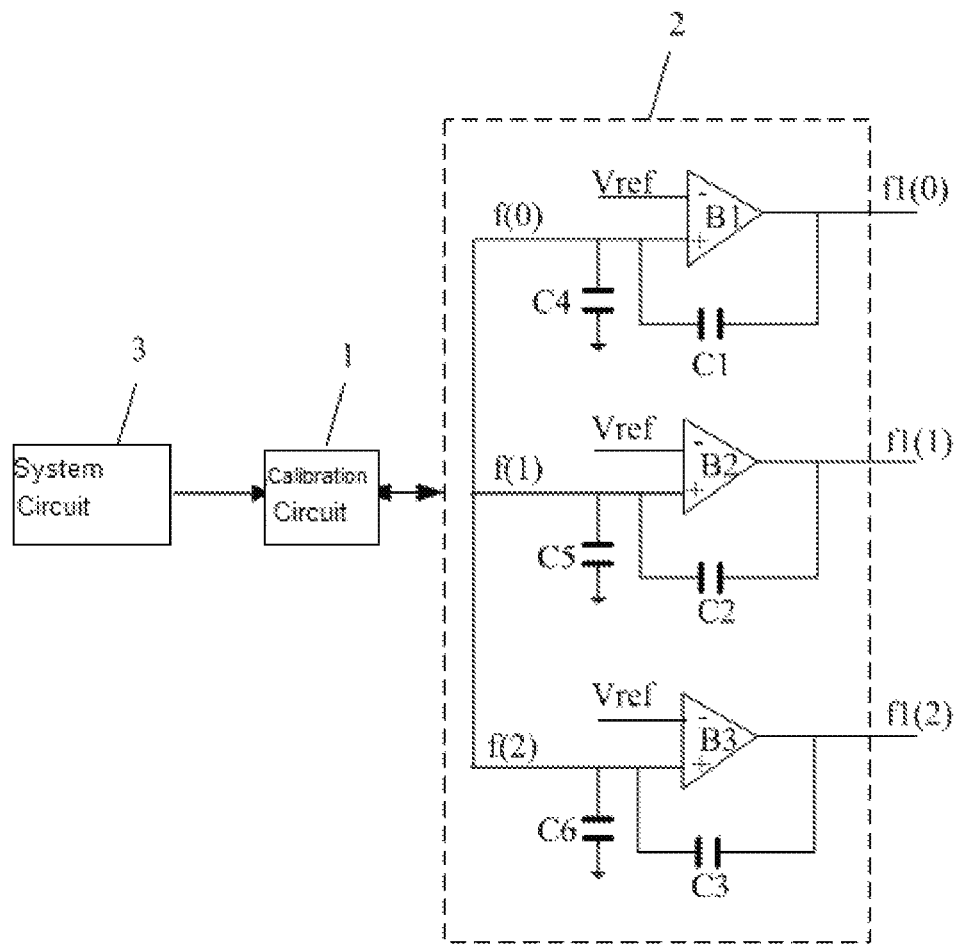
FIG. 2 is a schematic circuit diagram of a touch screen according to an embodiment of the disclosure.

As shown in FIG. 2, the touch screen includes a system circuit 3 for enabling other circuits. The calibration and subsequent operations are performed after the other circuits are enabled by the system circuit 3. In a charging process of the sensing capacitor in the touch screen, with the calibration device described above, the calibration excitation signal is sent to the touch screen, the preset reference voltages and the voltages of the sensing capacitor at the different frequency points are compared to obtain feedback voltage signals, and the voltage of the sensing capacitor is compensated by the feedback capacitor in case that there is a difference between the voltage of the sensing capacitor at a certain frequency point and the preset reference voltage, and thus the sensing capacitor is calibrated.

It is enough for the touch screen herein to correctly receive signals transmitted from the calibration device and receive the voltage signals fed back by the sensing capacitor inside the touch screen, and it is not necessary for the touch screen to configure the structure of the calibration device according to the structure of the touch screen, therefore the universality of the calibration device is good.

The calibration device described above can calibrate the capacitances of the sensing capacitor at the different frequency points so as to achieve a better touch effect. By employing the calibration device described above, the touch screen can provide a better touch experience.

An embodiment of the present disclosure also provides a display device including the aforementioned touch screen.

The display device may be any product or component having a display function such as a liquid crystal panel, an electronic paper, an OLED panel, a mobile phone, a tablet computer, a television, a displayer, a notebook computer, a digital photo frame, a navigator, and the like.

The display device can provide a superior touch experience while providing good display.

It can be understood that the above embodiments are merely exemplary embodiments employed to illustrate the principle of the present disclosure, but the present disclosure is not limited thereto. For a person of ordinary skill in the art, various variations and improvements may be made without departing from the spirit and essence of the present disclosure, and these variations and improvements are also considered as the protection scope of the present disclosure.

What is claimed is:

1. A calibration device for frequency point in a touch screen, configured for performing an automatic calibration on capacitances of a sensing capacitor in the touch screen at various frequency points, and comprising a calibration circuit and a comparison circuit, wherein
the calibration circuit is connected with the sensing capacitor and the comparison circuit, to transmit a calibration excitation signal to the touch screen to start calibration operations at the various frequency points, and calibrate the sensing capacitor in the touch screen according to a comparison result from the comparison circuit; and
the comparison circuit is configured for comparing a preset capacitance with a capacitance of the sensing capacitor in the touch screen at a current frequency point to obtain the comparison result, and feeding the comparison result back to the calibration circuit, so that the capacitance of the sensing capacitor is calibrated to a capacitance that matches with the current frequency point.

2. The calibration device according to claim 1, wherein the comparison circuit comprises a plurality of comparison sub-circuits in parallel, each of which is connected to a corresponding sensing capacitor in the touch screen, each of the comparison sub-circuits returns a difference between the preset capacitance and the capacitance of the sensing capacitor in the touch screen at the current frequency point to the calibration circuit, and the calibration circuit calibrates the capacitance of the sensing capacitor at the current frequency point.

3. The calibration device according to claim 2, wherein each of the plurality of comparison sub-circuits comprises a comparator, a feedback capacitor and a ground capacitor, the comparator is configured for comparing the preset capacitance with the capacitance of the sensing capacitor in the touch screen at the current frequency point to obtain the comparison result, and the feedback capacitor is configured for feeding the comparison result back to the calibration circuit.

4. A touch screen, comprising the sensing capacitor and the calibration device according to claim 2.

5. A display device, comprising the touch screen according to claim 4.

6. The calibration device according to claim 3, wherein a preset value of the feedback capacitor in each of the plurality of comparison sub-circuits equals to an average value of initial values of all feedback capacitors of the plurality of comparison sub-circuits corresponding to the various frequency points.

7. The calibration device according to claim 3, wherein the feedback capacitor is a variable capacitor.

8. A touch screen, comprising the sensing capacitor and the calibration device according to claim 3.

9. A display device, comprising the touch screen according to claim 8.

10. The calibration device according to claim 1, wherein the various frequency points comprise two to six frequency points in different frequency bands.

11. The calibration device according to claim 10, wherein the various frequency points comprise three frequency points, the three frequency points increase sequentially.

12. The calibration device according to claim 1, wherein the calibration excitation signal transmitted to the touch screen by the calibration circuit comprises a plurality of square signals with different timings, and a pulse width of each of the square signals matches with a corresponding frequent point.

13. A touch screen, comprising the sensing capacitor and the calibration device according to claim 12.

14. The calibration device according to claim 1, wherein the calibration circuit is further configured for performing a preliminary calibration on the capacitances of the sensing capacitor in the touch screen at the various frequency points, and the comparison circuit is further configured for comparing the preset capacitance with the capacitance of the sensing capacitor at the current frequency point to obtain the comparison result after the preliminary calibration, and feeding the comparison result back to the calibration circuit.

15. A touch screen, comprising the sensing capacitor and the calibration device according to claim 1.

16. A display device, comprising the touch screen according to claim 15.

17. A calibration method for frequency point in a touch screen, comprising:
- transmitting a calibration excitation signal to the touch screen to start calibration operations at various frequency points;
- collecting a capacitance of a sensing capacitor in the touch screen at each of the various frequency points; and
- calibrating a capacitance of the sensing capacitor at a current frequency point to a capacitance that matches with the current frequency point, by compensating the sensing capacitor according to a difference between a preset capacitance and the capacitance of the sensing capacitor at the current frequency point.

18. The calibration method according to claim 17, wherein the calibration excitation signal transmitted to the touch screen comprises a plurality of square signals with different timings, and a pulse width of each of the square signals matches with a corresponding frequent point.

19. The calibration method according to claim 17, further comprising establishing a corresponding relationship between the capacitance of the sensing capacitor and the preset capacitance at each of the frequency points.

20. The calibration method according to claim 19, wherein before establishing a corresponding relationship between the capacitance of the sensing capacitor and the preset capacitance at each of the frequency points, the method further comprises: performing a preliminary calibration on the capacitances of the sensing capacitor in the touch screen at the various frequency points; and
- establishing a corresponding relationship between the capacitance of the sensing capacitor and the preset capacitance at each of the frequency points further comprises:
- establishing a corresponding relationship between the capacitance of the sensing capacitor at each of the frequency points after the preliminary calibration and the preset capacitance.

\* \* \* \* \*